United States Patent

Blitchington, Jr.

[15] 3,679,903

[45] July 25, 1972

[54] APPARATUS FOR CONTROLLING THE INTENSITY OF RADIANT ENERGY ON A STRIP

[72] Inventor: Frank H. Blitchington, Jr., Greensboro, N.C.

[73] Assignee: Western Electric Company, Incorporated, New York, N.Y.

[22] Filed: Oct. 30, 1970

[21] Appl. No.: 85,634

[52] U.S. Cl. ....................................... 250/83.3 UV, 250/205

[51] Int. Cl. ........................................................ G01t 1/16

[58] Field of Search...250/43.5 R, 43.5 D, 83.3 UV, 250/205

[56] References Cited

UNITED STATES PATENTS

| | | | |
|---|---|---|---|
| 3,173,004 | 3/1965 | McKenzie | 250/43.5 D |
| 3,254,211 | 5/1966 | Black | 250/43.5 D |

*Primary Examiner*—James W. Lawrence
*Assistant Examiner*—Davis L. Willis
*Attorney*—W. M. Kain, R. P. Miller and W. L. Williamson

[57] ABSTRACT

A strip of ultraviolet sensitive material and masks are moved past a divergent source of ultraviolet radiation to expose the strip through the masks. The intensity of ultraviolet radiation is measured adjacent to the strip and the source is moved toward or away from the strip to maintain an intensity between low and high limits of intensity. Interlock facilities at the source sense the color temperature of the source to disable the source moving facilities and source cooling facilities if the source is emitting insufficient ultraviolet radiation.

3 Claims, 1 Drawing Figure

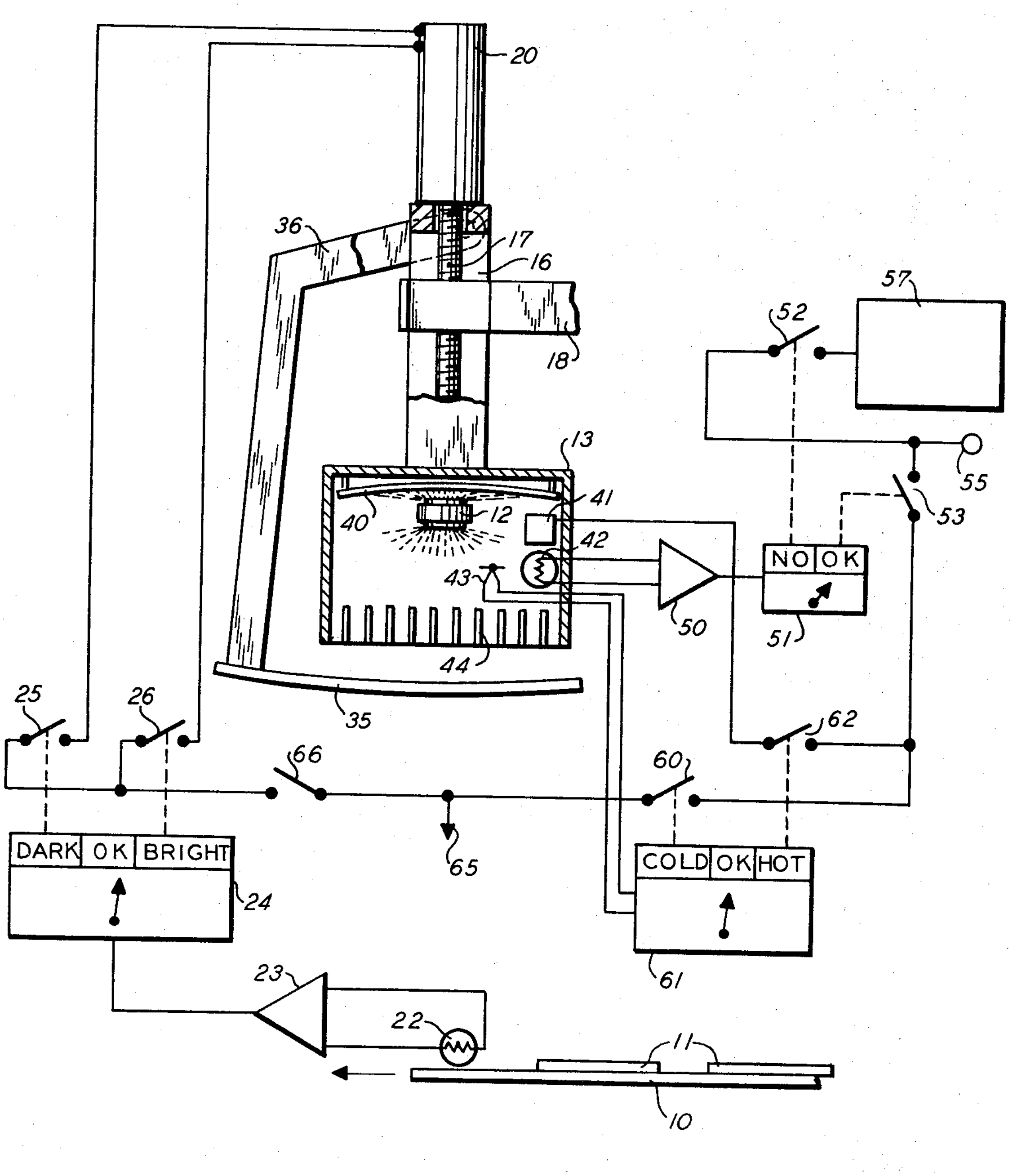
INVENTOR
F. H. BLITCHINGTON, JR.
By D. W. Marks
ATTORNEY

APPARATUS FOR CONTROLLING THE INTENSITY OF RADIANT ENERGY ON A STRIP

BACKGROUND OF THE INVENTION

1. Field of the Invention

In the manufacture of printed circuits, a flexible strip having radiant energy sensitive material deposited thereon is moved past a radiant energy source to expose the material to radiant energy. The quality and sharpness of the images produced on the radiant energy sensitive strip are dependent upon the intensity of the radiant energy. Accordingly, this invention relates to facilities for controlling the intensity of radiant energy applied to a strip.

2. Prior Art

The prior art describes a number of apparatus for exposing radiant energy sensitive material, such as printed circuit material, to radiant energy. However, none of the prior art describes facilities for controlling the intensity of radiant energy applied to the strip.

SUMMARY OF THE INVENTION

An object of the invention is a new and improved apparatus for exposing a strip to radiant energy.

Another object of the invention is an apparatus for maintaining an intensity of radiant energy on a strip between low and high limits of intensity.

In accordance with these and other objects, the invention contemplates a radiant energy source projecting a divergent beam on a strip wherein the intensity of radiant energy on the strip is sensed and the source is moved toward or away from the strip to maintain the intensity of radiant energy applied to the strip between low and high limits of intensity.

Additional facilities provide for the sensing of the radiant energy at the source to determine that it contains sufficient ultraviolet radiation to enable the source moving facilities.

BRIEF DESCRIPTION OF THE DRAWING

In the accompanying drawing, there is shown a diagram of an apparatus for controlling the intensity of radiant energy applied to a strip.

DETAILED DESCRIPTION

Referring to the accompanying drawing there is shown a strip 10 which may be a printed circuit material, such as a flexible insulative base on which a copper foil is laminated with the foil covered by a layer of radiant energy sensitive material. The radiant energy sensitive material may be an ultraviolet polymerizable monomer such as that sold under the trademark RISTON by DuPont de Nemours and Company of Delaware and under the trademark LAMINAR by Dynachem Corporation of California. The strip 10 is moved together with masks 11—11 beneath a divergent radiant energy source 12 supported in a light housing 13 to expose printed circuit patterns on the strip. The strip 10 and the masks 11—11 are moved in a conventional manner, such as on a conveyor (not shown), or by an apparatus similar to that described in application Ser. No. 80,365 filed by Mr. R. A. Harris on Oct. 13, 1970 with the title, "Apparatus For Conveying And Exposing A Strip Of Radiant Energy Sensitive Material." The radiant energy source may be an ultraviolet lamp such as a metal halide arc lamp.

The radiant energy sensitive material on the strip 10 is exposed to the radiant energy through the masks 11—11 to form images of the desired printed circuit patterns. It is necessary to apply a predetermined intensity of radiant energy to the strip in order to produce an optimum exposure or polymerization of the photosensitive material. If the intensity is too strong, the edges of the image may become feathered or fuzzy due to the scattering of the light beneath the edges of the mask. If the intensity is too low, the images are not fully formed resulting in poor quality circuits.

Along with the source 12, a reflector 40, an exhaust fan 41, an ultraviolet sensor 42, a thermocouple 43 and a partial collimator 44 are mounted in the housing 13. The output of the ultraviolet sensor 42 is amplified by an amplifier 50 which is applied to a relay meter 51 operating contacts 52 and 53. The ultraviolet sensor 42 senses the color temperature or intensity of ultraviolet radiation being emitted by the source 12. The intensity of ultraviolet radiation emitted by the source 12 may vary due to input voltage, temperature or age. If the intensity of ultraviolet radiation from the source is too low, the contacts 52 are closed to energize an alarm circuit 57 from a power terminal 55. When the source 12 produces ultraviolet radiation of sufficient intensity, the meter 51 closes the contacts 53 to connect the power terminal 55 to the operating circuit.

Since the temperature of the source 12 affects the intensity of emitted ultraviolet radiation, the thermocouple 43 senses the temperature in the housing 13 to operate a relay meter 61 with contacts 60 and 62. When the temperature is sufficiently high, the contacts 60 in series with the power terminal 55 and the contacts 53 are closed. When the temperature in the housing 13 increases too high, the switch 62 closes to connect the exhaust fan 41 to the power terminal 55 through the switch 53. Thus, if the color temperature of the source 41 is sufficient and the housing 13 is too hot, the fan cools the source 12.

The lower end of the housing 13 has a shutter 35 mounted on arms 36 which are pivotally mounted on a support 16. The shutter 35 is moved over and away from the opening of the housing 13 by suitable control facilities (not shown) operated by a signal on line 65. During loading or maintenance procedures the shutter is closed to protect operating personnel from overexposure to ultraviolet radiation. The shutter 35 is opened only when the strip 10 is being exposed; and then only when the color temperature and physical temperature is correct within the housing 13. Also, the power terminal 55 is de-energized during loading and maintenance procedures and is energized only when the strip 10 is to be exposed. A switch 66 in series with the switches 53 and 60 is positioned adjacent to the shutter 35 such that the shutter 35 closes the switch 66 only when the shutter is opened.

The housing 13 for the source 12 is connected to the support 16 which is moved by a screw mechanism 17 relative to a frame 18. The frame 18 is supported on a floor or an automatic apparatus such as that described in the above-mentioned Harris application. The screw 17 is selectively rotated by a reversible motor 20 to move the housing toward or away from the strip 10.

An ultraviolet sensor 22 is positioned adjacent to the strip 10. The ultraviolet sensor 22 senses the intensity of the ultraviolet radiation which is impinging upon the strip 10. The output of the sensor 22 is amplified by a bridge amplifier 23 and applied to a relay meter 24 which has normally opened contacts 25 and 26 operated by the meter. If the intensity of the ultraviolet radiation is less than a low limit of intensity, the meter indicates the intensity is too dark and closes the contacts 25 connected between the switch 66 and a forward winding of the motor 20 to move the housing 13 toward the strip 10 to increase the intensity of ultraviolet radiation on the strip 10. If the intensity of the ultraviolet radiation is greater than a high limit of intensity, the meter indicates the intensity is too bright and closes contacts 26 connected between the switch 66 and a reverse winding of the motor 20 to move the housing 13 away from the strip 10 to decrease the intensity of ultraviolet radiation on the strip 10.

The ultraviolet sensors 22 and 42 are selected to have a frequency response similar to the response of the photosensitive material on the strip 10. For example, Model No. 7UV10 ultraviolet sensor sold by Clarex Corporation of Mount Vernon, New York has been found to adequately match the frequency response of the above-mentioned RISTON and LAMINAR photopolymerizable monomer materials.

It is to be understood that the above-described embodiments are simply illustrative of the principles of the invention and many other embodiments can be devised without departing from the scope and spirit of the invention.

What is claimed is:

1. An apparatus for exposing a strip of radiant energy sensitive material to an intensity of radiant energy between low and high limits of intensity, comprising:

a lamp mounted in a housing for projecting a divergent beam of radiant energy on the strip;

a first intensity responsive radiant energy sensor mounted adjacent the strip;

means operated by the first sensor for moving the lamp and housing relatively toward the strip when the intensity of radiant energy on the strip is less than the low limit of intensity and for moving the lamp and housing relatively away from the strip when the intensity of radiant energy on the strip is greater than the high limit of intensity;

a second intensity responsive radiant energy sensor mounted in the housing; and means operated by the second sensor for disabling the moving means when the intensity of radiant energy in the housing is less than a predetermined intensity.

2. An apparatus as defined in claim 1 wherein:

the radiant energy sensitive material is sensitive to ultraviolet radiation;

the lamp is an ultraviolet lamp; and the first and second sensors sense the intensity of ultraviolet radiation.

3. An apparatus as defined in claim 2, which includes:

a thermocouple mounted in the housing; and means actuated by the disabling means and operated by the thermocouple for blowing air in the housing when the intensity of ultraviolet radiation in the housing exceeds the predetermined intensity and the temperature in the housing exceeds a predetermined temperature.

* * * * *